United States Patent
Yasunori

(10) Patent No.: US 8,134,218 B2
(45) Date of Patent: Mar. 13, 2012

(54) SOLID-STATE IMAGE CAPTURING DEVICE, SOLID-STATE IMAGE CAPTURING APPARATUS, AND ELECTRONIC INFORMATION DEVICE

(75) Inventor: Kitamura Yasunori, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 749 days.

(21) Appl. No.: 12/157,784

(22) Filed: Jun. 12, 2008

(65) Prior Publication Data

US 2009/0009639 A1    Jan. 8, 2009

(30) Foreign Application Priority Data

Jun. 15, 2007   (JP) .................. 2007-158824

(51) Int. Cl.
*H01L 31/0232* (2006.01)
*H04N 5/335* (2006.01)
(52) U.S. Cl. .............. 257/432; 257/E31.127; 348/294
(58) Field of Classification Search .......... 348/294, 348/335, E5.091; 257/431, 229, 680, E31.127, 257/232, 223, 704, 432
See application file for complete search history.

(56) References Cited

U.S. PATENT DOCUMENTS

| 2006/0023313 A1* | 2/2006 | Kim .......................... 359/620 |
| 2007/0109439 A1* | 5/2007 | Minamio et al. ............ 348/340 |
| 2007/0145419 A1* | 6/2007 | Park .......................... 257/223 |

FOREIGN PATENT DOCUMENTS

JP   2006-165195   6/2006

* cited by examiner

*Primary Examiner* — Thomas L Dickey
*Assistant Examiner* — Nikolay Yushin
(74) *Attorney, Agent, or Firm* — Edwards Wildman Palmer LLP

(57) ABSTRACT

A solid-state image capturing device is provided, and in a pixel section in the center of a chip where a plurality of light receiving elements are arranged in two dimensions, an on-chip lens for focusing incident light is provided on each of the plurality of light receiving elements in a corresponding manner; and a dummy pattern made of a material for the on-chip lens is provided on a peripheral circuit section on an outer circumference side of the chip in order to improve the heat-resisting property at the time of reflow soldering.

11 Claims, 5 Drawing Sheets

(a)

(b) A-A' cross sectional view (a)

(b)

Fig.3  *Prior Art*
(a)
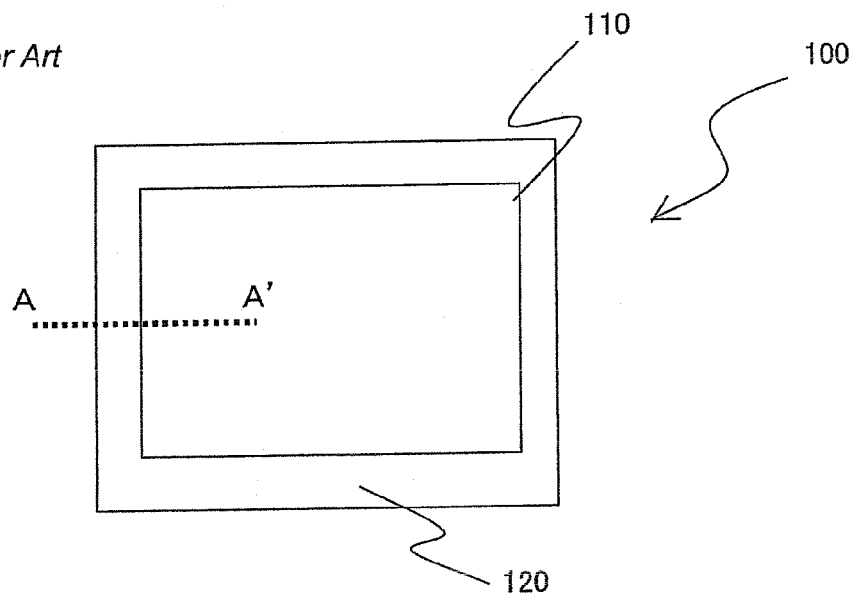
Fig.3  *Prior Art*
(b) A-A' cross sectional view
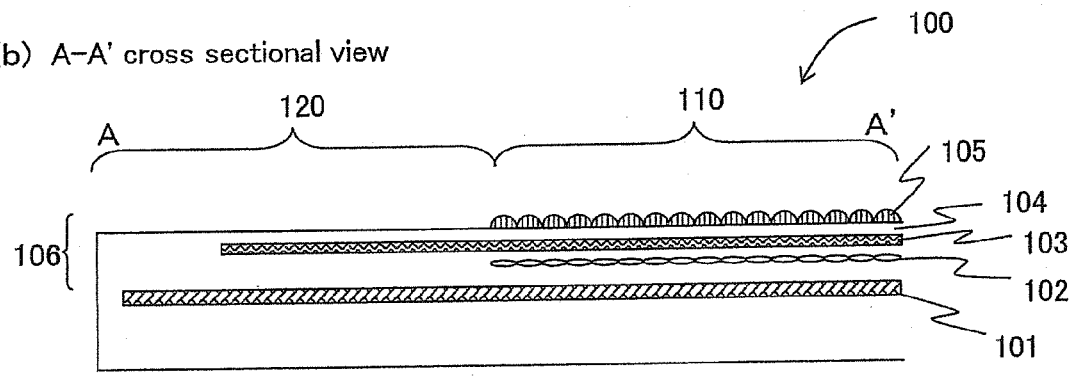

(a)

(b)

SOLID-STATE IMAGE CAPTURING DEVICE, SOLID-STATE IMAGE CAPTURING APPARATUS, AND ELECTRONIC INFORMATION DEVICE

This Nonprovisional Application claims priority under 35 U.S.C. §119(a) on Patent Application No. 2007-158824 filed in Japan on Jun. 15, 2007, the entire contents of which are hereby incorporated by reference.

BACKGROUND OF THE INVENTION

1. Field of the Invention

The present invention relates to a solid-state image capturing device including a semiconductor device for capturing image light from a subject by photoelectric conversion and a manufacturing method thereof; a solid-state image capturing apparatus having a high heat-resisting property and having the solid-state image capturing device mounted on a substrate by reflow soldering; and an electronic information device, such as a digital camera (e.g., digital video camera and digital still camera), an image input camera, a scanner, a facsimile machine and a camera-equipped cell phone device, having the solid-state image capturing apparatus as an image input device in an image capturing section of the electronic information device.

2. Description of the Related Art

Conventionally, in order to improve the light focusing rate of a light receiving section provided in CCD-type and CMOS-type solid-state image capturing devices for receiving image light from the subject, a corresponding on-chip lens is coupled to each light receiving section. Further, in order to improve the light focusing rate, an inner-layer lens may be provided in between the on-chip lens and the light receiving section. Further, in order to capture a color image, a color filter layer is provided under the location of the on-chip lens in a corresponding manner.

FIG. 3(a) is a top view schematically showing an exemplary structure of a conventional common solid-state image capturing device, and FIG. 3(b) is a longitudinal cross sectional view along the line A-A' in FIG. 3(a).

In FIG. 3(a), a conventional solid-state image capturing device 100 is provided with a pixel section 110 and a peripheral circuit section 120, the pixel section 110 being an imaging area having multiple light receiving sections arranged in the center of the chip and the peripheral circuit section 120 being in the peripheral section around the pixel section 110.

In the pixel section 110, which is an imaging area, a plurality of photoelectric conversion elements (light receiving sections) for photoelectrically converting incident light to generate a signal charge, such as a photodiode, are provided in a matrix as a pixel section, and a CCD for reading out and transferring a signal charge from each photoelectric conversion element or a CMOS transistor for reading out a signal charge is further provided. As shown in FIG. 3(b), the photoelectric conversion elements are provided in a semiconductor layer 101, such as a silicon (Si) layer, and a gate electrode, which is a metal layer such as an Al layer, is provided thereon, and further a shading layer and/or a wiring is positioned on the gate electrode. Over the photoelectric conversion elements, an inner-layer lens 102, a color filter 103, a protective layer 104 and an on-chip lens 105, with inter layer films interposed between them, are laminated in this order in a corresponding manner over each photoelectric conversion element.

In addition, in the peripheral circuit section 120, a signal processing circuit is provided to conduct varieties of image signal processing for an image signal read out from each light receiving section in the pixel section 110. The signal processing circuit is formed with a layer shown as the semiconductor layer 101 in FIG. 3. Over the semiconductor layer 101, a color filter 103, a protective layer 104, and an on-chip lens 105 are further provided thereon.

FIG. 4(a) is an enlarged top view schematically showing a part of an exemplary structure of the peripheral circuit section 120 in FIG. 3(a), and FIG. 4(b) is a longitudinal cross sectional view along the line B-B' in FIG. 4(a).

As shown in FIGS. 4(a) and 4(b), the peripheral circuit section 120 is provided with a bonding pad 107 as an external connection terminal, the bonding pad 107 being made from a semiconductor layer that is the same layer as the semiconductor layer 101, and the protective layer 104 is opened by an opening 104a over the bonding pad 107. The bonding pad 107, which is a square in a plane view, is provided at the bottom of the opening 104a.

Reference 1: Japanese Laid-Open Publication No. 2006-165195

SUMMARY OF THE INVENTION

The conventional solid-state image capturing device described above, however, has the following problems.

According to the conventional solid-state image capturing device described above, a resin material is often used as a resin layer 106 for the inner-layer lens 102, the color filter 103, the protective layer 104 and the on-chip lens 105. However the resin material has a problem associated with the heat-resistance.

When the conventional solid-state image capturing device described above is mounted on a substrate by reflow soldering, cracks do not occur because the semiconductor layer 101 has sufficient heat-resistance; however, cracks occur in the resin layer 106 and particularly in the protective layer 104 that have insufficient heat-resistance. In many cases, the crack occurs at the outer circumference edge of the resin layer 106, with a point of crack origin at a corner of a pattern. In the case of FIG. 4(a), for example, a crack may occur from a pattern corner C of the opening 104a of the protective layer 104 near the bonding pad 107.

As described above, if reflow soldering is conducted on the conventional solid-state image capturing device to mount the solid-state image capturing device on a substrate, where the solid-state image capturing device is affected by the high temperature, the resin 106 may be damaged by the high temperature and cracks may occur. If the cracks occur, malfunctioning may occur such as a significant decrease in the environmental stability and an inability to image. It is considered to thicken the film of the protective layer 104 in order to prevent the crack from occurring. However, as the thickness of the resin layer 106 increases, incident light decreases causing the light receiving sensitivity to decrease.

Thus, soldering is conducted by hand when the conventional solid-state image capturing device described above is mounted on a substrate, causing the accuracy of the mounting to decrease and the cost to increase due to the increase in man hours. Further, a problem of a decreased soldering strength arises if the temperature of the reflow soldering is lowered. Further, manufacturing steps and manufacturing cost increase if a special package is used.

The present invention is intended to solve the conventional problems described above, and the objective of the present invention is to provide a solid-state image capturing device and a manufacturing method thereof, the solid-state image capturing device and the manufacturing method preventing the occurrence of cracks and improving the heat-resisting property to make mounting onto a substrate possible by reflow soldering, without causing the mounting accuracy to decrease or causing the manufacturing steps and the cost to increase or causing the performance including the light receiving sensitivity to decrease; a solid-state image capturing apparatus having the solid-state image capturing device mounted on a substrate by reflow soldering; and an electronic information device, such as a camera-equipped cell phone device, having the solid-state image capturing apparatus as an image input device in an image capturing section of the electronic information device.

A solid-state image capturing device according to the present invention is provided, where, in a pixel section in the center of a chip where a plurality of light receiving elements are arranged in two dimensions, an on-chip lens for focusing incident light is provided on each of the plurality of light receiving elements in a corresponding manner; and a dummy pattern made of a material for the on-chip lens is provided on a peripheral circuit section on an outer circumference side of the chip in order to improve the heat-resisting property at the time of reflow soldering.

In a solid-state image capturing device according to the present invention, an external connection terminal is provided on the peripheral circuit section on the outer circumference side of the chip, a protective layer is provided over both the pixel section and the peripheral circuit section and in a manner to open over the external connection terminal, and the dummy pattern is provided on the protective layer near the external connection terminal.

In a solid-state image capturing device according to the present invention, the dummy pattern is provided on a peripheral edge around an opening of the protective layer.

In a solid-state image capturing device according to the present invention, the shape of the opening of the protective layer in a plane view is either a rectangular or a square, and the external connection terminal is provided at the bottom of the opening.

In a solid-state image capturing device according to the present invention, the external connection terminal is provided in a same layer as a semiconductor layer provided for the pixel section in the center of the chip.

In a solid-state image capturing device according to the present invention, a corner of the opening is radiused or the corner is buried.

In a solid-state image capturing device according to the present invention, the plurality of light receiving sections for photoelectrically converting incident light to generate a signal charge are provided in a matrix in longitudinal and transverse directions in the pixel section in the center of the chip, and wherein a controller circuit for reading out and controlling a image signal from the plurality of light receiving sections and a signal processing circuit for conducting varieties of image signal processing for the image signal read out from the light receiving sections are provided in the peripheral circuit section, and at least either one of the controller circuit and the signal processing circuit is connected to the external connection terminal.

In a solid-state image capturing device according to the present invention, the material for the protective layer and the on-chip lens is an organic transparent acrylic resin.

A solid-state image capturing device manufacturing method according to the present invention is provided for manufacturing a solid-state image capturing device according to the present invention, the method comprising: an on-chip lens pattern and dummy pattern forming step of applying a material for an on-chip lens on an entire surface of a chip and forming the on-chip lens pattern on the pixel section by a lithography process, and forming the dummy pattern on the peripheral circuit section.

A solid-state image capturing device manufacturing method according to the present invention, further includes, as a preceding step of the on-chip lens pattern and dummy pattern forming step: a light receiving section and gate electrode forming step of forming a plurality of light receiving sections on a semiconductor substrate or on a semiconductor layer provided on the substrate and forming a gate electrode on a semiconductor layer adjacent to the light receiving section; and a color filter and a protective layer forming step of forming a color filter and a protective layer in this order on the plurality of light receiving sections and the gate electrode in a corresponding manner to each of the plurality of light receiving sections.

A solid-state image capturing apparatus according to the present invention has a solid-state image capturing device according to the present invention mounted on a substrate by reflow soldering.

An electronic information device according to the present invention has a solid-state image capturing apparatus as an image input device, the solid-state image capturing apparatus being formed by mounting the solid-state image capturing device according to the present invention on a substrate by reflow soldering.

The functions of the present invention having the structures described above will be described herein after.

It is important to improve the heat-resisting strength of the resin layer in order to prevent cracks when the solid-state image capturing device is mounted on a substrate by reflow soldering. For this purpose, it is considered to thicken the thickness of the protective layer. However, as the thickness of the resin layer increases, incident light decreases causing the light receiving sensitivity of each of the light receiving section to decrease.

Therefore, the present invention improves the heat-resisting strength of the resin layer by providing an on-chip lens material for the peripheral circuit section as a dummy pattern, which is not conventionally provided in the peripheral circuit section. Especially, it is preferable to provide the dummy pattern for the peripheral circuit section of the opening of the protective layer near the external connecting terminal, which is a point of crack origin. As a result, mounting of the solid-state image capturing device on a substrate becomes possible by reflow soldering while preventing the occurrence of a crack and improving the heat-resisting property and without causing the mounting accuracy for the solid-state image capturing device on a substrate to decrease or causing the manufacturing steps and the cost to increase or causing the imaging performance including the light receiving sensitivity to decrease.

According to the manufacturing method for the conventional solid-state image capturing device, in forming an on-chip lens, a non-chip lens material is applied for the entire surface of a substrate section and the on-chip lens material around a peripheral circuit section is removed by a photolithography process. According to the manufacturing method for the solid-state image capturing device of the present invention, what is needed is to form a dummy pattern at the peripheral circuit section and to change a mask pattern, and it will not cause the increase in cost due to the increase in man hours.

According to the present invention with the structure described above, a dummy pattern made of an on-chip material is provided for a peripheral circuit section. As a result, the increase in the manufacturing steps, the increase in cost or the decrease of the light receiving performance does not occur, and the occurrence of the crack is prevented to bring yields, and the heat-resisting property of the solid-state image capturing device is improved, making it possible to mount the solid-state image capturing device on a substrate by reflow soldering.

These and other advantages of the present invention will become apparent to those skilled in the art upon reading and understanding the following detailed description with reference to the accompanying figures.

BRIEF DESCRIPTION OF THE DRAWINGS

FIG. 3(a) is a top view schematically showing an exemplary structure of a conventional common solid-state image capturing device, and FIG. 3(b) is a longitudinal cross sectional view along the line A-A' in FIG. 3(a).

Figure 1:
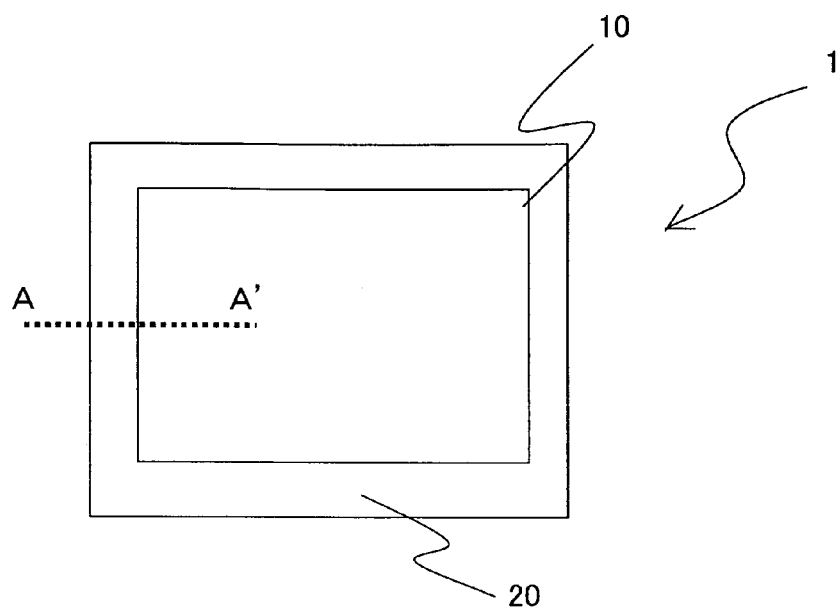
FIG. 1(a) is a top view schematically showing an exemplary structure of a solid-state image capturing device according to the embodiment of the present invention.
FIG. 1(b) is a longitudinal cross sectional view along the line A-A' of FIG. 1(a).
Figure 1:
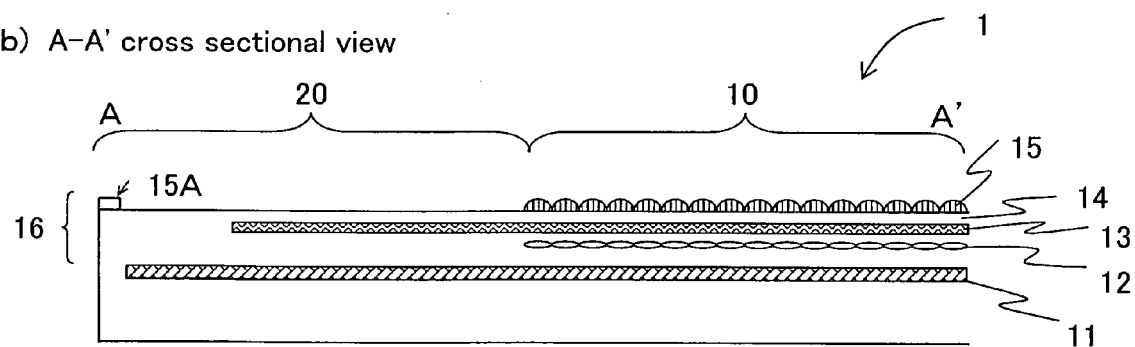

1 solid-state image capturing device
10 pixel section (imaging area)
11 semiconductor layer
12 inner-layer lens
13 color filter
14 protective layer
14a opening
15 on-chip lens
15A dummy pattern
16 resin layer
17 bonding pad
20 peripheral circuit section
90 electronic information device
91 solid-state image capturing apparatus
92 memory section
93 display section
94 communication section
95 image output section

DESCRIPTION OF THE PREFERRED EMBODIMENTS

Hereinafter, the embodiment of the solid-state image capturing device and the manufacturing method of solid-state image capturing device according to the present invention will be described in detail in reference to the attached figures.

FIG. 1(a) is a top view schematically showing an exemplary structure of a solid-state image capturing device according to the embodiment of the present invention, and FIG. 1(b) is a longitudinal cross sectional view along the line A-A' of FIG. 1(a).

In FIGS. 1(a) and 1(b), a solid-state image capturing device 1 according to the embodiment of the present invention is provided with a pixel section 10, which is an imaging area having multiple light receiving elements (photodiodes) as a light receiving section arranged in the center of the chip. In the outer circumference section of the chip around the pixel section 10, a peripheral circuit section 20 is provided, the peripheral circuit section 20 formed of a controller circuit and the like for reading out and controlling imaging signals from multiple light receiving sections in the pixel section 10.

The structure of the pixel section 10 is the same as that of the conventional solid-state image capturing device 100 shown in aforementioned FIGS. 3(a) and 3(b). A plurality of photoelectric conversion elements (light receiving sections) for photoelectrically converting incident light and generating a signal charge, are provided as light receiving elements such as a photodiode, in a matrix in longitudinal and transverse directions. In addition, the pixel section 10 includes a CCD for reading out and transferring a signal charge from each photoelectric conversion element or a CMOS transistor for converting the signal charge into a signal voltage and reading out an amplified signal in accordance with the signal voltage.

As shown in FIG. 1(a), the solid-state image capturing devices, such as a CCD image sensor and a CMOS image sensor, includes a semiconductor layer 11, which is made of silicon (Si) and the like, formed on a substrate. Over the semiconductor layer 11 except for the light receiving section, a gate electrode made of an Al layer and the like is provided, and further above, a shading film, a wiring and the like are provided. Over each light receiving section, an inner-layer lens 12, a color filter 13, a protective layer 14 and an on-chip lens 15, with inter layer films interposed between them, are laminated in this order in a corresponding manner over each light receiving section. The inner-layer lens 12, the color filter 13 and the protective layer 14 are made of a resin material, and they are indicated as a resin layer 16 in FIG. 1.

Besides the controller circuit described above, the peripheral section 20 around the pixel section 10 is provided with a signal processing circuit for conducting varieties of image signal processing, such as analog signal processing and subsequent digital signal processing (white balance, gamma correction, and the like), for an image signal read out from each light receiving section in the pixel section 10. The signal processing circuit is formed with a transistor and the like in FIG. 1, and the transistor is formed with a layer shown as the semiconductor layer 11. The color filter 13 and the protective layer 14 are provided over the semiconductor layer 11. The color filter 13 is provided over the peripheral circuit in the peripheral circuit section 20 in order to prevent malfunction caused by a bright light entering the transistor circuit in the peripheral circuit section 20. Further, a dummy pattern 15A is provided for the peripheral circuit section 20 to improve a heat-resisting property for reflow soldering, the dummy pattern 15A made of an on-chip lens material. The material for both the protective layer 14 and the on-chip lens 15 (dummy pattern 15A) is an organic transparent acrylic resin. Therefore, a crack due to the protective layer 14 and the dummy pattern 15A rarely occurs.

Figure 2:
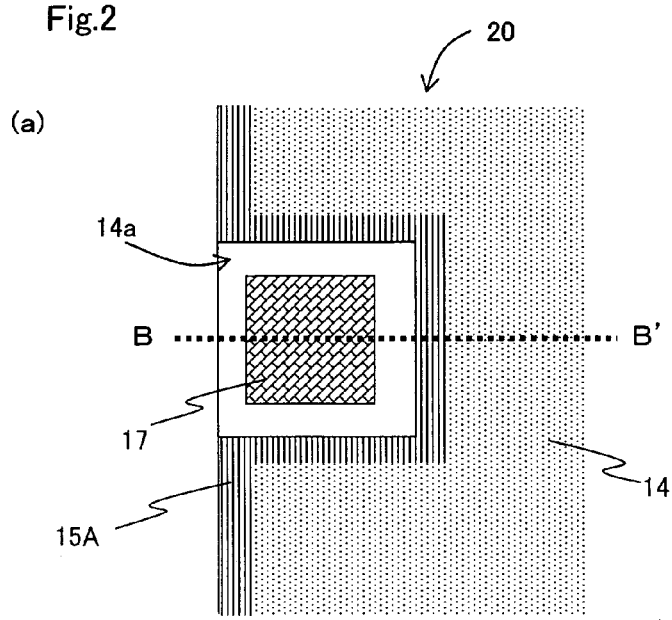
FIG. 2(a) is an enlarged top view schematically showing an exemplary structure of a peripheral circuit section in FIG. 1(a)
FIG. 2(b) is a longitudinal cross sectional view along the line B-B' in FIG. 2(a).
Figure 2:
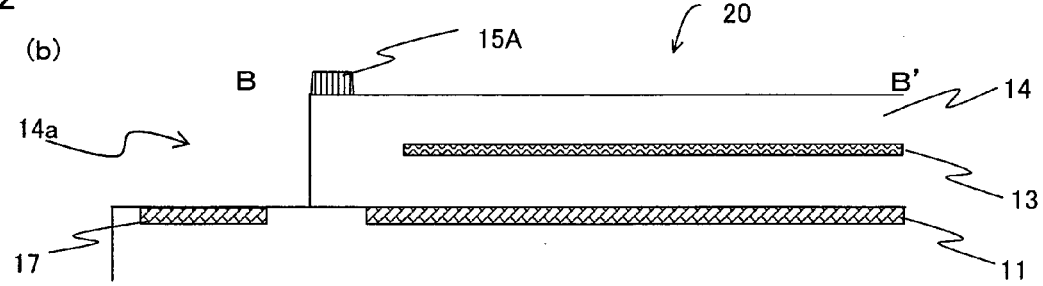
Figure 4:
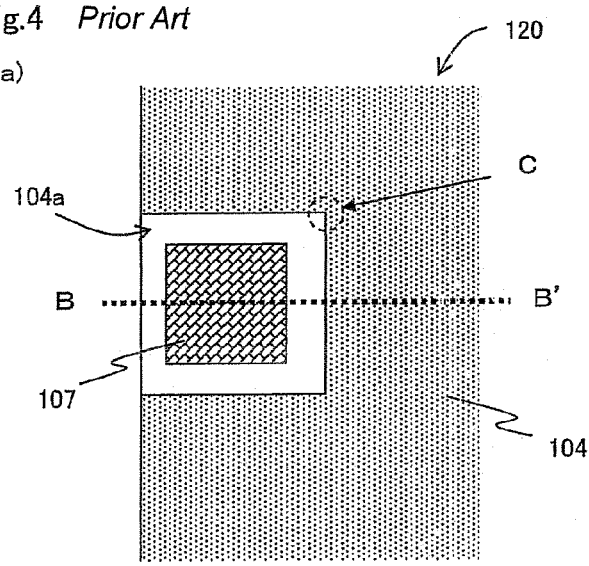
FIG. 4(a) is an enlarged top view schematically showing a part of an exemplary structure of the peripheral circuit section 120 in FIG. 3(a)
FIG. 4(b) is a longitudinal cross sectional view along the line B-B' in FIG. 4(a).
Figure 4:
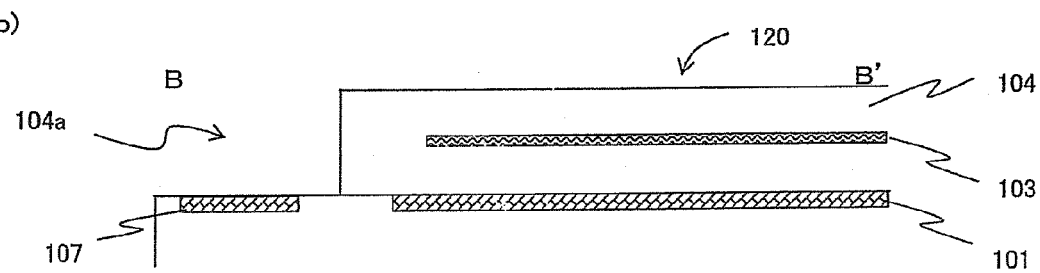

FIG. 2(a) is an enlarged top view schematically showing an exemplary structure of a peripheral circuit section in FIG. 1(a), and FIG. 2(b) is a longitudinal cross sectional view along the line B-B' in FIG. 2(a).

In FIGS. 2(a) and 2(b), a bonding pad 17 is formed as an external connection terminal in the peripheral circuit section 20 by the same layer as the semiconductor layer 11. The protective layer 14 is formed by opening the layer over the bonding pad 17 with an opening 14a. The bonding pad 17 is provided at the bottom of the opening 14a of the protective layer 14.

In FIG. 2(a), the bonding pad 17 is a square (or a rectangle) in a plane view. The dummy pattern 15A having a predetermined width is provided over the protective layer 14 near the bonding pad 17, namely along the periphery of the opening of the protective layer 14.

Hereinafter, a manufacturing method for the solid-state image capturing device 1 according to the embodiment of the present invention will be described.

First, as a light receiving section and gate electrode forming step, a plurality of light receiving sections are formed on a semiconductor substrate or on a semiconductor layer provided on a substrate, and a gate electrode is formed on the semiconductor layer adjacent to each light receiving section.

Next, as a color filter and protective layer forming step, the inner-layer lens 12 (this layer can be omitted), the color filter 13 and the protective layer 14, with inter layer films interposed between them, are laminated in this order.

Subsequently, the on-chip lens 15 is formed on a chip having the inner-layer lens 12, the color filter 13 and the protective layer 14 formed thereon. At the same time, as an on-chip lens pattern and dummy pattern forming step, a resin material for an on-chip lens is applied for the entire surface of the chip, and an on-chip lens pattern is formed by a photolithography process to form the on-chip lens 15 in the pixel section 10. More specifically, the dummy pattern 15A is patterned in a convex form on the peripheral edge portion of the peripheral circuit section 20. The on-chip lens 15 is formed, for example, by melting the on-chip lens pattern.

As described above, the dummy pattern 15A on the peripheral edge portion in the peripheral circuit section 20 does not need to be in the same form (belt shape having a predetermined width) as the on-chip lens 15 in the pixel section 10, and any form can be selected in accordance with a peripheral pattern form of the location where the dummy pattern is arranged. This can be conducted by one patterning at the same time with the patterning for forming the on-chip lens 15.

Then, the solid-state image capturing device 1 according to the embodiment of the present invention is mounted on a substrate by reflow soldering in order to form a solid-state image capturing apparatus.

According to the embodiment of the present invention with the structure described above, the same material for the on-chip lens is arranged as the dummy pattern 15A on the peripheral edge around the opening 14a of the protective layer 14, which is a point of crack origin, so that the heat-resisting strength of the resin layer 16 can be improved. Because this solid-state image capturing device has an excellent heat-resisting property, it can be mounted on a substrate by reflow soldering.

In addition, the on-chip lens material is applied for the entire surface of a substrate section and the on-chip lens material around a peripheral circuit section is removed by a photolithography process in the manufacturing method for the conventional solid-state image capturing device. Even if a dummy pattern is formed in the peripheral circuit section as described in the embodiment of the present invention, only the mask pattern is changed and it will not lead to the increase in the steps or the consequent increase in the cost.

Accordingly, on account of the prevention of the occurrence of a crack in the protective film and the improvement of the head-resisting property, a solid-state image capturing device that can be mounted on a substrate by reflow soldering is obtained without causing the mounting accuracy of the solid-state image capturing device on a substrate to decrease or causing the manufacturing steps and the cost to increase or causing the performance including the light receiving sensitivity at the light receiving section to decrease.

In addition, although not described in detail in the embodiment described above, a corner of the opening 14a can be radiused or the corner of the opening 14a can be buried.

Further, although not described in detail in the embodiment described above, an electronic information device will be described herein after. The electronic information device, such as a digital camera (e.g., digital video camera and digital still camera), an image input camera (e.g., monitoring camera, a door intercom camera, a car-mounted camera, a camera for television telephone and a camera for cell phone), a scanner, a facsimile machine and a camera-equipped cell phone device, has an image capturing section using the solid-state image capturing apparatus according to the embodiment of the present invention described above as an image input device.

Figure 5:
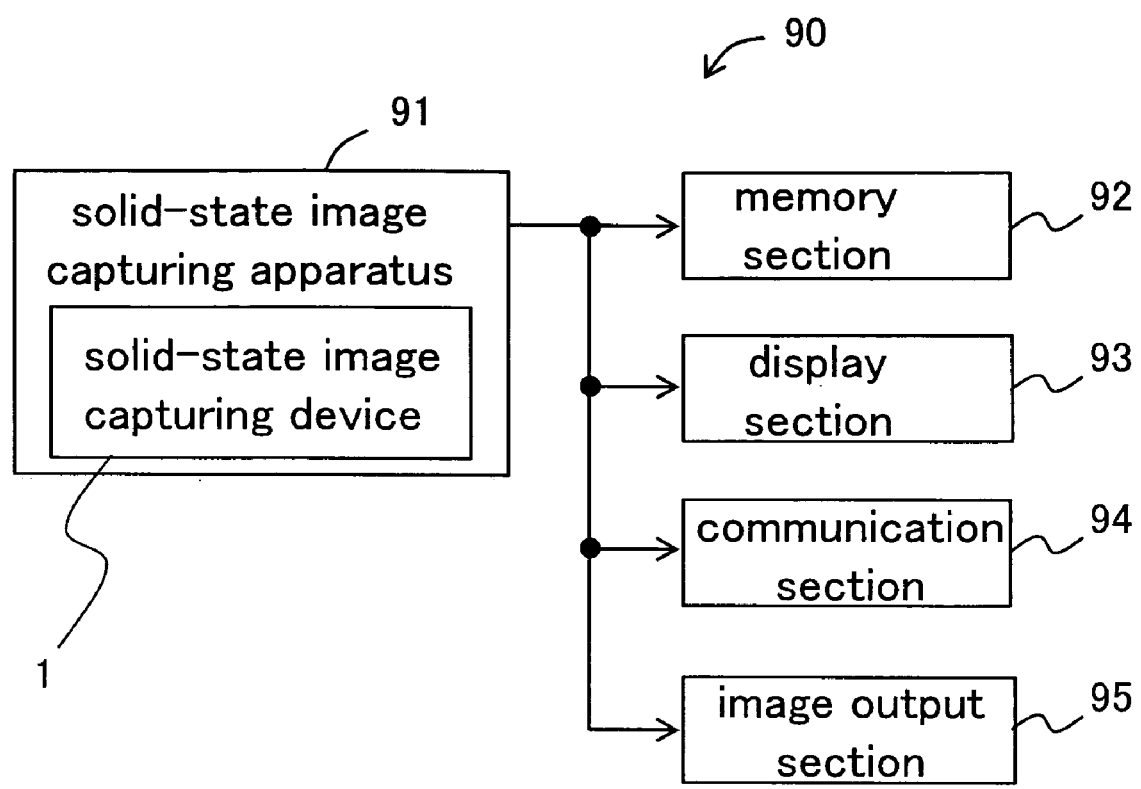
FIG. 5 is a block diagram showing an exemplary schematic structure of an electronic information device using a solid-state image capturing apparatus, which includes the solid-state image capturing device according to the embodiment of the present invention, for an image capturing section.

FIG. 5 is a block diagram showing an exemplary schematic structure of an electronic information device using a solid-state image capturing apparatus, which includes the solid-state image capturing device according to the embodiment of the present invention, for an image capturing section.

In FIG. 5, the electronic information device 90 according to the present invention includes a solid-state image capturing apparatus 91, which is formed by mounting the solid-state image capturing device 1 according to the embodiment of the present invention on a substrate by reflow soldering and is provided with a signal processing circuit for conducting varieties of image signal processing for the image signal from the solid-state image capturing device 1. Further, the electronic information device 90 according to the present invention includes at least any of: a memory section 92 (e.g., recording media) for data-recording a high-quality image data obtained by the solid-state image capturing apparatus 91 used as an image capturing section after a predetermined signal process is performed on the image data for recording; a display section 93 (e.g., liquid crystal display device) for displaying this image data from the solid-state image capturing apparatus 91 on a display screen (e.g., liquid crystal display screen) after a predetermined signal process is performed for display; a communication section 94 (e.g., transmitting and receiving device) for communicating this image data from the solid-state image capturing apparatus 91 after a predetermined signal process is performed on the image data for communication; and an image output section 95 for printing (typing out) and outputting (printing out) this image data from the solid-state image capturing apparatus 91.

As described above, the present invention is exemplified by the use of its preferred embodiment. However, the present invention should not be interpreted solely based on the embodiment described above. It is understood that the scope of the present invention should be interpreted solely based on the claims. It is also understood that those skilled in the art can implement equivalent scope of technology, based on the description of the present invention and common knowledge from the description of the detailed preferred embodiment of the present invention. Furthermore, it is understood that any patent, any patent application and any references cited in the present specification should be incorporated by reference in the present specification in the same manner as the contents are specifically described therein.

INDUSTRIAL APPLICABILITY

In the field of a solid-state image capturing device including a semiconductor device for capturing image light from a subject by photoelectric conversion and a manufacturing method thereof, a solid-state image capturing apparatus having a high heat-resisting property and having the solid-state image capturing device mounted on a substrate by reflow soldering, and an electronic information device, such as a digital camera (e.g., digital video camera and digital still camera), an image input camera, a scanner, a facsimile machine and a camera-equipped cell phone device, having the solid-state image capturing apparatus as an image input device in an image capturing section of the electronic information device, the present invention provides a dummy pattern made of an on-chip material for a peripheral circuit section, so that the increase in the manufacturing steps, the increase in cost or the decrease of the light receiving performance does not occur, and the occurrence of the crack is prevented to bring yields, and the heat-resisting property of the solid-state image capturing device is improved, making it possible to mount the solid-state image capturing device on a substrate by reflow soldering.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A solid-state image capturing device, wherein:
   in a pixel section in the center of a chip where a plurality of light receiving elements are arranged in two dimensions, an on-chip lens for focusing incident light is provided on each of the plurality of light receiving elements in a corresponding manner; and
   a dummy pattern made of a same material as that of the on-chip lens is provided on an outer circumference edge of a protective layer on a peripheral circuit section on an outer circumference side of the chip in order to improve the heat-resisting property of the protective layer at the time of reflow soldering, wherein the dummy layer is farmed in the same layer as the on-chip lens.

2. A solid-state image capturing device according to claim 1, wherein an external connection terminal is provided on the peripheral circuit section on the outer circumference side of the chip, the protective layer is provided over both the pixel section and the peripheral circuit section and in a manner to open over the external connection terminal, and the dummy pattern is provided on the protective layer near the external connection terminal.

3. A solid-state image capturing device according to claim 2, wherein the dummy pattern is provided on a peripheral edge around an opening of the protective layer.

4. A solid-state image capturing device according to claim 2, wherein the shape of the opening of the protective layer in a plane view is either a rectangular or a square, and the external connection terminal is provided at the bottom of the opening.

5. A solid-state image capturing device according to claim 2, wherein the external connection terminal is provided in a same layer as a semiconductor layer provided for the pixel section in the center of the chip.

6. A solid-state image capturing device according to claim 4, wherein the external connection terminal is provided in a same layer as a semiconductor layer provided for the pixel section in the center of the chip.

7. A solid-state image capturing device according to claim 2, wherein a corner of the opening is radiused or the corner is buried.

8. A solid-state image capturing device according to claim 1,
   wherein the plurality of light receiving sections for photoelectrically converting incident light to generate a signal charge are provided in a matrix in longitudinal and transverse directions in the pixel section in the center of the chip, and
   wherein a controller circuit for reading out and controlling a image signal from the plurality of light receiving sections and a signal processing circuit for conducting varieties of image signal processing for the image signal read out from the light receiving sections are provided in the peripheral circuit section, and at least either one of the controller circuit and the signal processing circuit is connected to the external connection terminal.

9. A solid-state image capturing device according to claim 2, wherein the material for the protective layer and the on-chip lens is an organic transparent acrylic resin.

10. A solid-state image capturing apparatus having a solid-state image capturing device according to claim 1 mounted on a substrate by reflow soldering.

11. An electronic information device having a solid-state image capturing apparatus as an image input device, the solid-state image capturing apparatus being formed by mounting the solid-state image capturing device according to claim 1 on a substrate by reflow soldering.

* * * * *